United States Patent

Arai et al.

[11] Patent Number: 6,059,846
[45] Date of Patent: May 9, 2000

[54] BONDING WIRE HEIGHT INSPECTION DEVICE

[75] Inventors: Hisashi Arai, Akiruno; Masaru Inomata, Musashimurayama; Masayuki Shimura, Tokorozawa, all of Japan

[73] Assignee: Kabushiki Kaisha Shinkawa, Tokyo, Japan

[21] Appl. No.: 09/042,843

[22] Filed: Mar. 17, 1998

[30] Foreign Application Priority Data

Mar. 17, 1997 [JP] Japan .................................. 9-083233

[51] Int. Cl.$^7$ ...................................... H01L 21/00
[52] U.S. Cl. .............................................. 29/25.01
[58] Field of Search ............................. 29/25.01

[56] References Cited

U.S. PATENT DOCUMENTS 5,293,217  3/1994  Sugawara .
5,298,989  3/1994  Tsukahara et al. .
5,394,246  2/1995  Sugawara .

FOREIGN PATENT DOCUMENTS 8-83829  3/1996  Japan .

*Primary Examiner*—David E. Graybill
*Attorney, Agent, or Firm*—Koda & Androlia

[57] ABSTRACT

A device for inspecting a high loop of a wire bonded on, for instance, a lead frame including a frame carrying stand, which guides and supports a lead frame, and an inspection roller, which is installed directly above the frame carrying stand. The inspection roller has frame pressing parts made as an insulating part so as to press the side portions of the lead frame against the frame carrying stand 31; and the inspection roller further has a wire detection part made as conductive parts provided between the frame pressing ring. A step or height difference between the frame pressing parts and the wire detection part is formed so as to be equal to the upper-limit value of the maximum height of wire loops formed by the bonded wire, and high loops that exceed the upper-limit value are detected by way of an electric current that flows when the wire detection part contacts the bonded wire.

5 Claims, 5 Drawing Sheets

BONDING WIRE HEIGHT INSPECTION DEVICE

BACKGROUND OF THE INVENTION

1. Field of the Invention

The present invention relates to a device for inspecting the height of wires bonded between pads of semiconductor chips and leads on lead frames and more particularly to a bonding wire height inspection device for inspecting bonded wires that exceed the allowable maximum wire loop heights.

2. Prior Art

Japanese Patent Application Pre-Examination Publication (Kokai) No. 8-83829 discloses a conventional device for inspecting the height of bonded wires.

In the method used in this device, the correlation between wire height and wire width is investigated beforehand by changing the focusing level of an optical system, and the inspection level that constitutes the focusing level of the optical system is set from the upper-limit value and lower-limit value which act as standards for the height of the wire to be inspected. The acceptability of the wire height is then ascertained by determining whether or not the wire width obtained by imaging the inspected wire is within the range of the upper-limit value and lower-limit value in the correlation between wire height and wire width.

In this prior art, each wire is inspected; and therefore, if a defective wiring occurs, it is possible to ascertain the defective wire; and in addition, it is also possible to ascertain whether or not each wire is within a specific allowable range. In case the number of wires is small, it is possible to inspect the wire bonding process and wire inspection process on-line, thus making it possible to check all the wires.

On the other hand, since in the above prior art the acceptability of wires is ascertained by processing the images of individual wires, considerable inspection time is required if the number of wires is large; as a result, a sampling check is only available. However, when defective wiring occurs, with such a sampling check, there is a risk of a large number of defective products being generated at a later time as a result of the time lag between the wire bonding process and the inspection process.

In general, semiconductor assembly devices include, as shown in FIG. 6(b), island-down type devices in which an island 1a (which is an attachment part for a semiconductor chip 2) of the lead frame 1 is formed as a recess. In such island-down type devices, a height difference between the leads 1b of the lead frames 1 and the pads of the semiconductor chips 2 is extremely small. In FIG. 6(b), the reference numeral 3 indicates a wire connected between the pad of the semiconductor chip 2 and a lead 1b of the lead frame 1, and 4 indicates a package which are molded so as to protect the wire 3.

Thus, in the case of island-down type lead frames 1, there is almost no risk of the wires 3 shorting out on the edges of the semiconductor chips 2. Accordingly, a low wire loop shape (i. e., a loop shape in which the maximum height of the wire 3 is low) does not present any particular problems.

In the case of a high loop shape (i. e., a loop shape in which the maximum height of the wire 3 is high), however, there is a risk that the wire 3 will protrude from the package 4; accordingly, an inspection is necessary for such high loop shape wires. In cases where such island-down type lead frame 1 is inspected for high loop shapes, if the number of wires 3 is large and an inspection of all of the wires needs to be done, then the prior art described above cannot handle the inspection. Furthermore, since an expensive apparatus is required, there has been a demand for a device which can inspect all of the wires using an inexpensive apparatus.

SUMMARY OF THE INVENTION

Accordingly, the object of the present invention is to provide a bonding wire height inspection device which can inspect bonded wires of high loop shapes in a short time even in cases where the number of wires to be inspected is large, and which can inspect all wires for acceptable or unacceptable high loop shapes by means of a simple apparatus so that the wire bonding process and wire inspection process can be performed on-line.

The above object is accomplished by a unique structure for a bonding wire height inspection device of the present invention which is characterized in that the device includes a frame carrying stand which is installed in the conveying path of lead frames conveyed from a wire bonding section so as to guide and support the lead frames thereon, and an inspection roller which is installed directly above the frame carrying stand and includes frame pressing parts which presses the side edge portions of the lead frames against the frame carrying stand and wire detection parts which are located between the frame pressing parts, wherein the frame pressing parts are formed as insulating parts while the wire detection parts are formed as conductive parts, a step difference between the frame pressing parts and wire detection parts is formed so as to be an upper-limit value of the maximum height of the wire loops, so that high loops of wires bonded on the lead frame and exceeding the upper-limit value are inspected when the wire detection parts of the roller contact the wires and electric current flows in between.

In the above structure, both ends of the inspection roller are rotatably supported by inspection roller holders installed on both sides of the frame carrying stand, and the inspection roller holders are urged downward by a spring means; in other words, the inspection roller supported by the roller holders are urged toward the frame carrying stand.

Furthermore, in the present invention, the inspection roller is made of an insulating material, conductive members are installed in the wire detection parts of the inspection roller, and a conductive rod is installed inside the inspection roller along the axial center thereof so as to contact the wire detection parts via the conductive members, and a brush is provided so as to be pressed against the conductive rod; thus bonded wires exceeding the upper-limit height value are inspected by the electric current that flows through the brush when the wire detection parts contact such bonded wires.

BRIEF DESCRIPTION OF THE INVENTION

FIG. 6 illustrates one example of a semiconductor device, in which FIG. 6(a) is the top view and FIG. 6(b) is the sectional view.

DETAILED DESCRIPTION OF THE INVENTION

One embodiment of the present invention will be described with reference to an embodiment shown in FIGS. 1 through 6.

Figure 1:
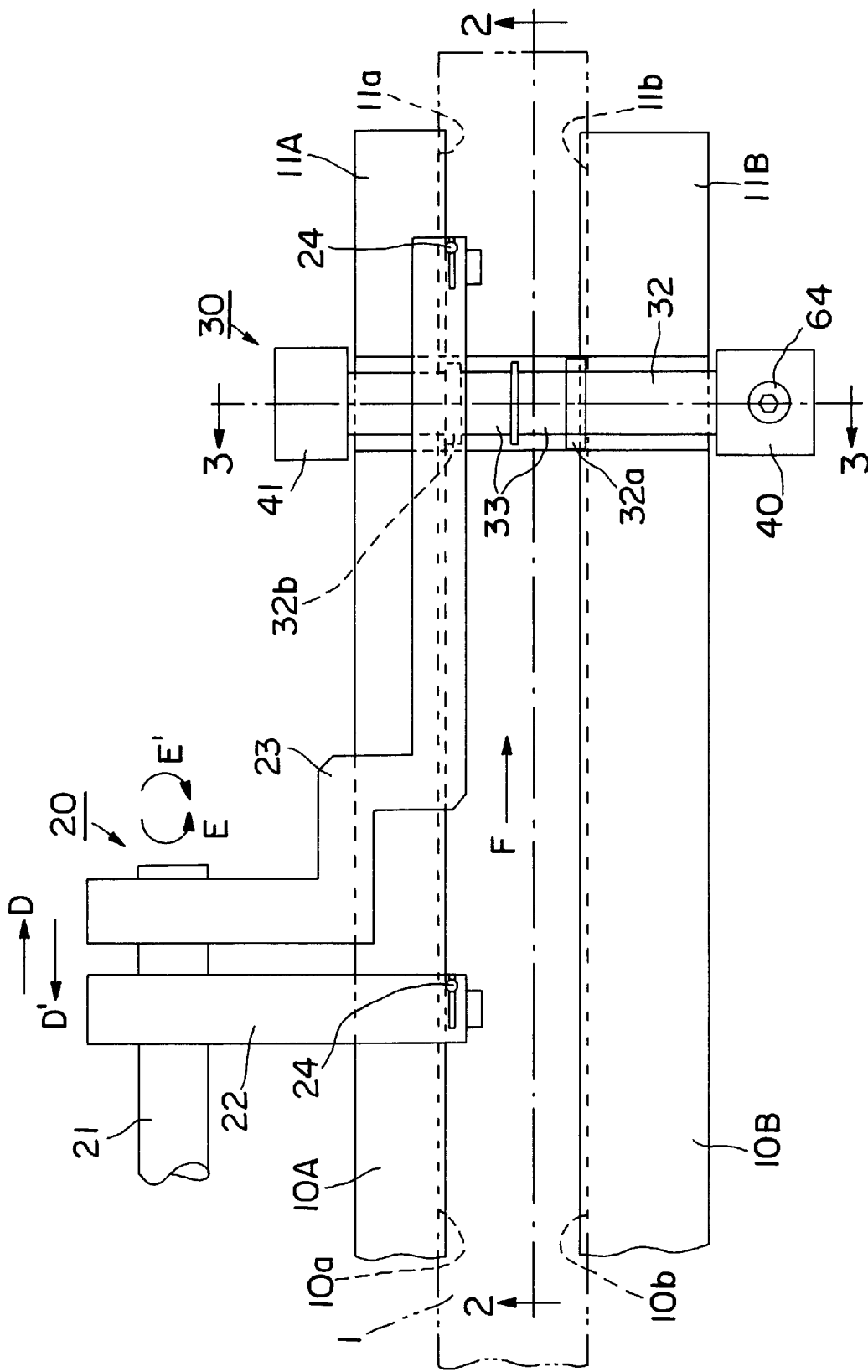
FIG. 1 is a top view illustrating one embodiment of the bonding wire height inspection device of the present invention.
Figure 2:
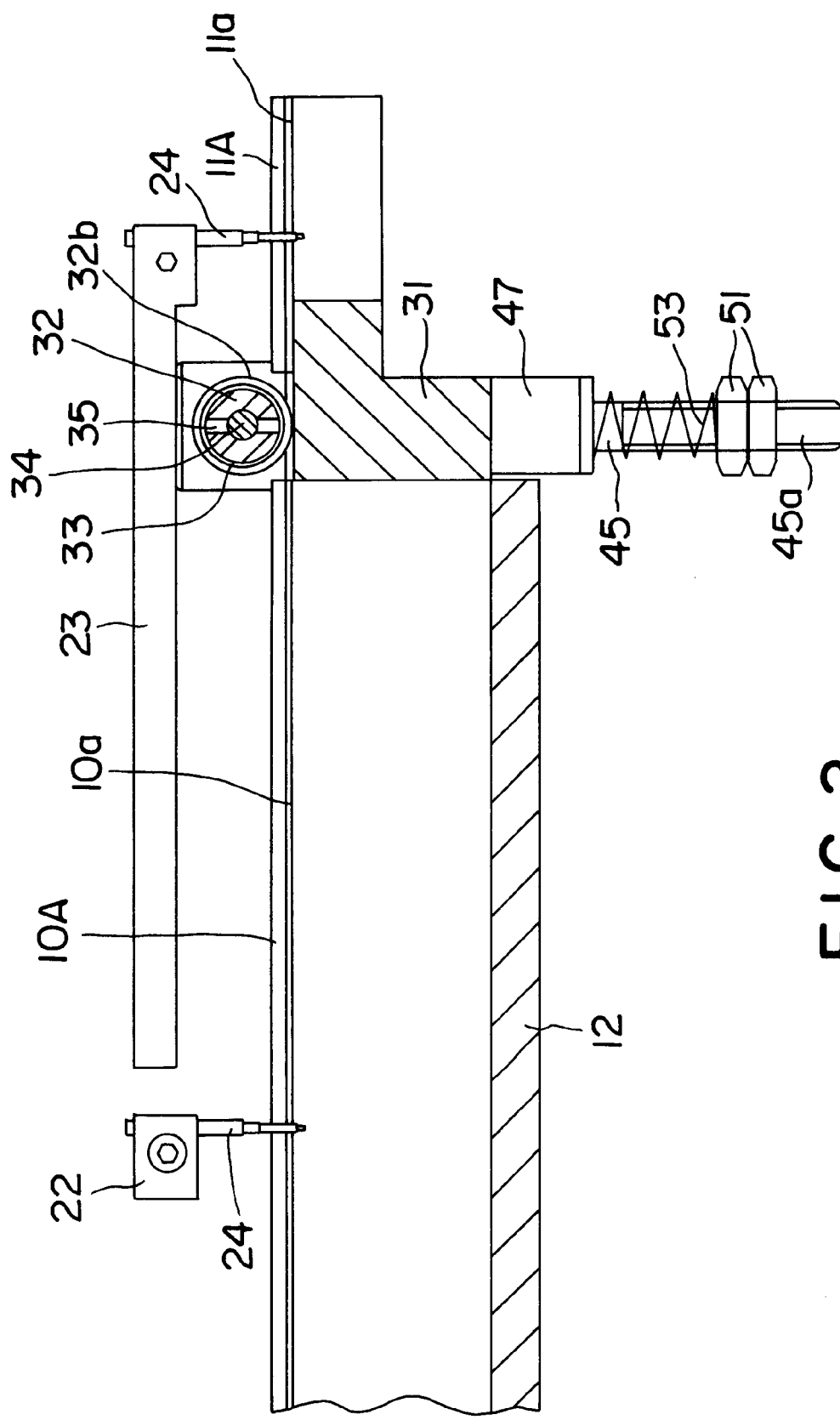
FIG. 2 is a sectional view taken along the line 2—2 in FIG. 1.

As seen from FIG. 1, the embodiment includes: first pair of guide rails 10A and 10B and second pair of guide rails 11A and 11B, the guide rails of each pair being installed so as to face each other and guide a lead frame 1 that is sent from a wire bonding section (not shown) following the completion of wire bonding thereon; a frame-feeding means 20 which feeds the lead frame 1 by tact-feeding; and an inspection device 30 which is installed between the first guide rails 10A and 10B and the second guide rails 11A and 11B.

The guide rails 10A and 10B are respectively provided with guide grooves 10a and 10b which face each other; and the guide rails 11A and 11B are also respectively provided with guide grooves 11a and 11b that face each other. These guide rails guide the lead frame 1 via the guide grooves. The undersurface of the guide rails 10A and 10B are fastened to a base plate 12; and the guide rails 11A are 11B are provided on a frame carrying stand 31 of the inspection device 30 which will be described later.

The frame-feeding means 20 has a universally known structure and will therefore be described only briefly. A feeding pin shaft 21 of the frame-feeding means 20 makes a reciprocating motion in the directions of arrows D and D' and a reciprocating rotational motion in the directions of arrows E and E' by a driving means (not shown). Feeding arms 22 and 23 are fastened to the feeding pin shaft 21, and feeding pins 24 which engage with feeding holes 1c of the lead frames 1 are fastened to the feeding arms 22 and 23.

Next, the structure of the inspection device 30 will be described with reference to FIGS. 3 through 5.

A frame carrying stand 31 is fastened to the right end portions (in FIG. 1) of the guide rails 10A and 10B, and frame grooves 31a which guide and support the lead frame 1 are formed in the upper surface of the frame carrying stand 31. In addition, island grooves 31b which support the undersurface of the islands 1a of the lead frame 1 are formed in the frame grooves 31a and extend in the conveying direction of the lead frames 1 (i. e., in the direction of arrow F in FIG. 1).

An inspection roller 32 consisting of an insulating material such as a ceramic, etc. is installed on the upper surface of the frame carrying stand 31 so as to extend at right angles to the conveying direction F of the lead frame 1.

Frame pressing ring parts 32a and 32b which press both side portions of the lead frame 1 against the frame grooves 31a are formed on the inspection roller 32. In addition, wire detection parts 33 consisting of a conductive material are disposed on the surfaces of recessed grooves formed between the frame pressing ring parts 32a and 32b. In other words, since a ceramic is used as the material of the inspection roller 32, the wire detection parts 33 are formed so that an electroless nickel plating treatment is performed on the wire detection parts (which is a ceramic), and then a metal plating treatment is applied on top of this, so that the wire detection parts 33 are electrically conductive.

Figure 3:
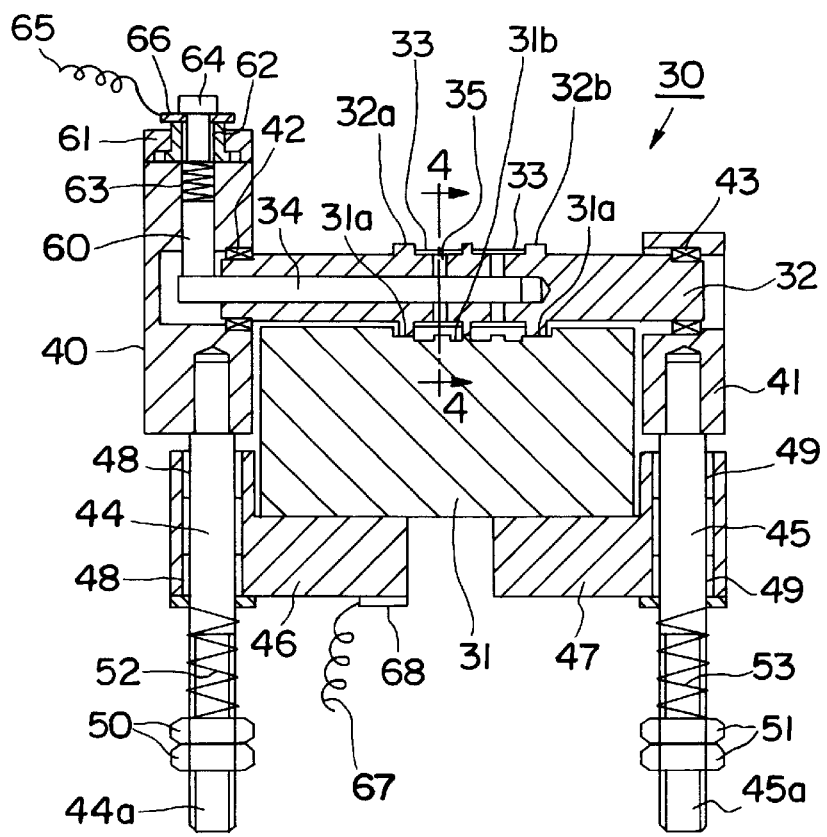
FIG. 3 is a sectional view taken along the line 3—3 in FIG. 1.
Figure 4:
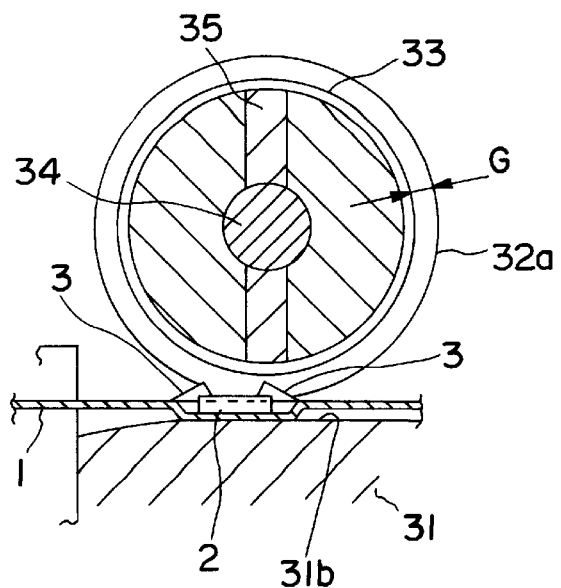
FIG. 4 is a sectional view taken along the line 4—4 in FIG. 1.

The frame pressing ring parts 32a and 32b and the wire detection parts 33 differ in the height (or depth) in FIG. 3, and such a step difference G between the frame pressing ring parts 32a and 32b and the wire detection parts 33 is set so as to be the upper-limit value of the maximum height of a wire 3 bonded to the lead frame 1.

Furthermore, a conductive rod 34 consisting of a conductive material such as a copper material, etc. is installed in place in the axial center of the inspection roller 32. The conductive rod 34 extends from one end of the roller 32 to the location where the wire inspection parts 33 are formed as best seen from FIG. 5. Furthermore, conductive members 35 such as solder, etc. are embedded in holes formed in the inspection roller 32 so that the wire detection parts 33 are conductively connected to the conductive rod 34 by way of the conductive members 35. In other words, the conductive members 35 installed in the wire detection parts 33 are in contact with the conductive rod 34.

The inspection roller 32 is rotatably supported at both ends thereof, via respective bearings 42 and 43, by inspection roller holders 40 and 41 which are installed on both sides of the frame carrying stand 31. The inspection roller holder 40 provided on side of the conductive rod 34 consists of an insulating material.

The upper ends of raising-and-lowering rods 44 and 45 are inserted and fastened in place in the undersides of the inspection roller holders 40 and 41; and these raising-and-lowering rods 44 and 45 are supported via respective bearings 48 and 49 in fixed holders 46 and 47 which are fastened to the frame carrying stand 31. The raising-and-lowering rods 44 and 45 thus can be freely raised and lowered in FIG. 3. Furthermore, threaded sections 44a and 45a are formed on the lower end portions of the raising-and-lowering rods 44 and 45, and nuts 50 and 51 are screwed onto these threaded sections 44a and 45a. In addition, springs 52 and 53 are installed on the portions of the raising-and-lowering rods 44 and 45 located between the fixed holders 46 and 47 and the nuts 50 and 51, so that the raising-and-lowering rods 44 and 45 are urged downward by these springs 52 and 53.

Figure 5:
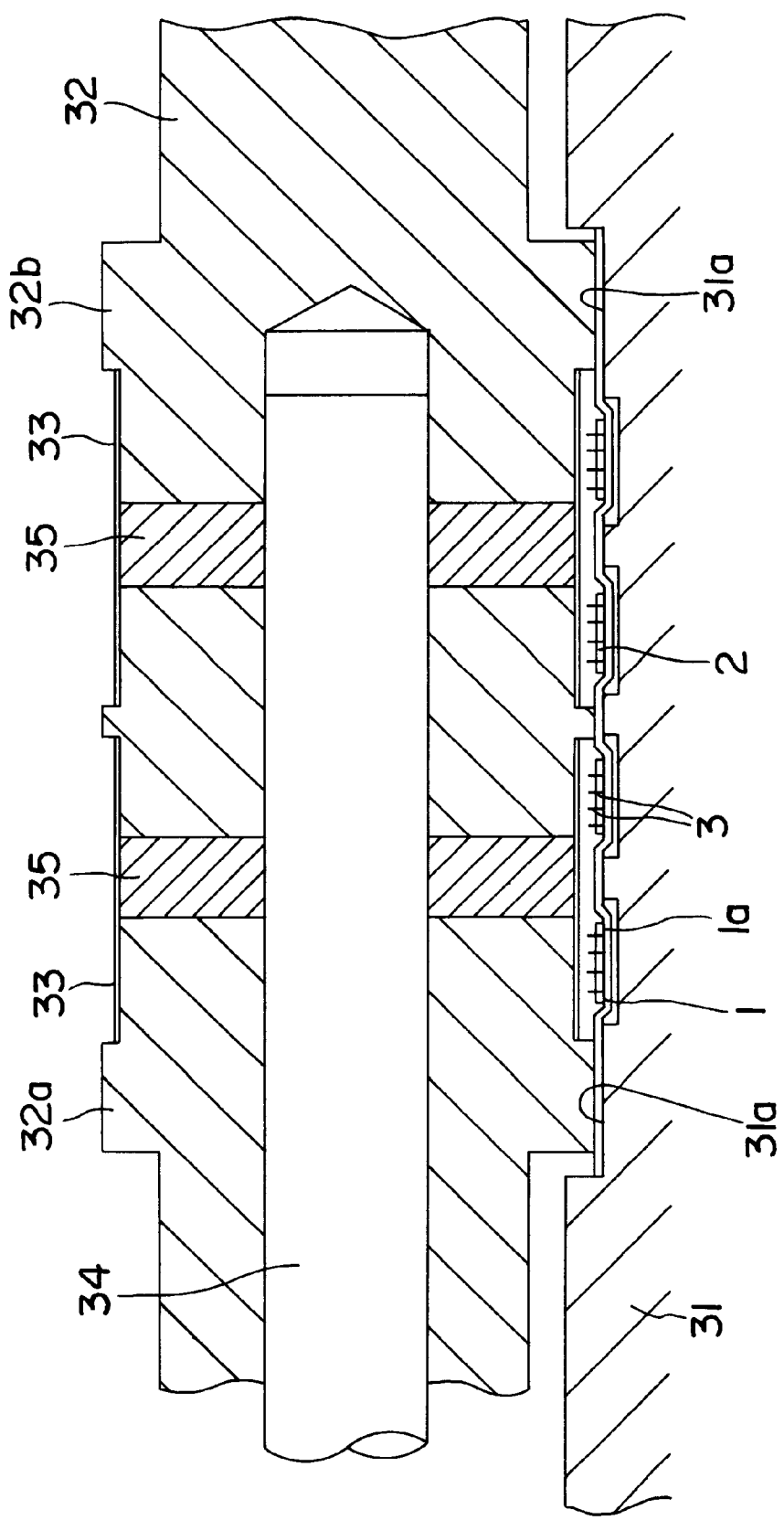
FIG. 5 is an enlarged view of essential parts in FIG. 3.

Since the raising-and-lowering rods 44 and 45 are urged downward (in FIGS. 2, 3, and 4), the inspection roller 32 is also driven downward via the inspection roller holders 40 and 41, so that the frame pressing ring parts 32a and 32b of the inspection roller 32 can press the lead frame 1 against the frame grooves 31a of the frame carrying stand 31 as best seen from FIG. 5.

A brush 60 consisting of a conductive material is installed in the inspection roller holder 40 so that the brush 60 can be moved up and down (in FIG. 3) and contacts the conductive rod 34.

More specifically, an upper plate 61 is fastened to the upper end of the inspection roller holder 40, and an internally-threaded screw 62 consisting of an insulating material is disposed in the center of the upper plate 61. A spring 63 is installed in the portion of the inspection roller holder 40 that is located between the brush 60 and the female screw 62; and this spring is pressed by a bolt 64 which is screwed into the female screw 62, so that the brush 60 can be pressed against the conductive rod 34.

In addition, a connecting terminal 66 which has wiring 65 is installed between the female screw 62 and bolt 64; and a connecting terminal 68 which has an electric wiring 67 is also attached to the fixed holder 46. The wiring 65 and 67 is connected to a detection circuit (not shown).

Next, the operation of the inspection device will be described.

Figure 6:
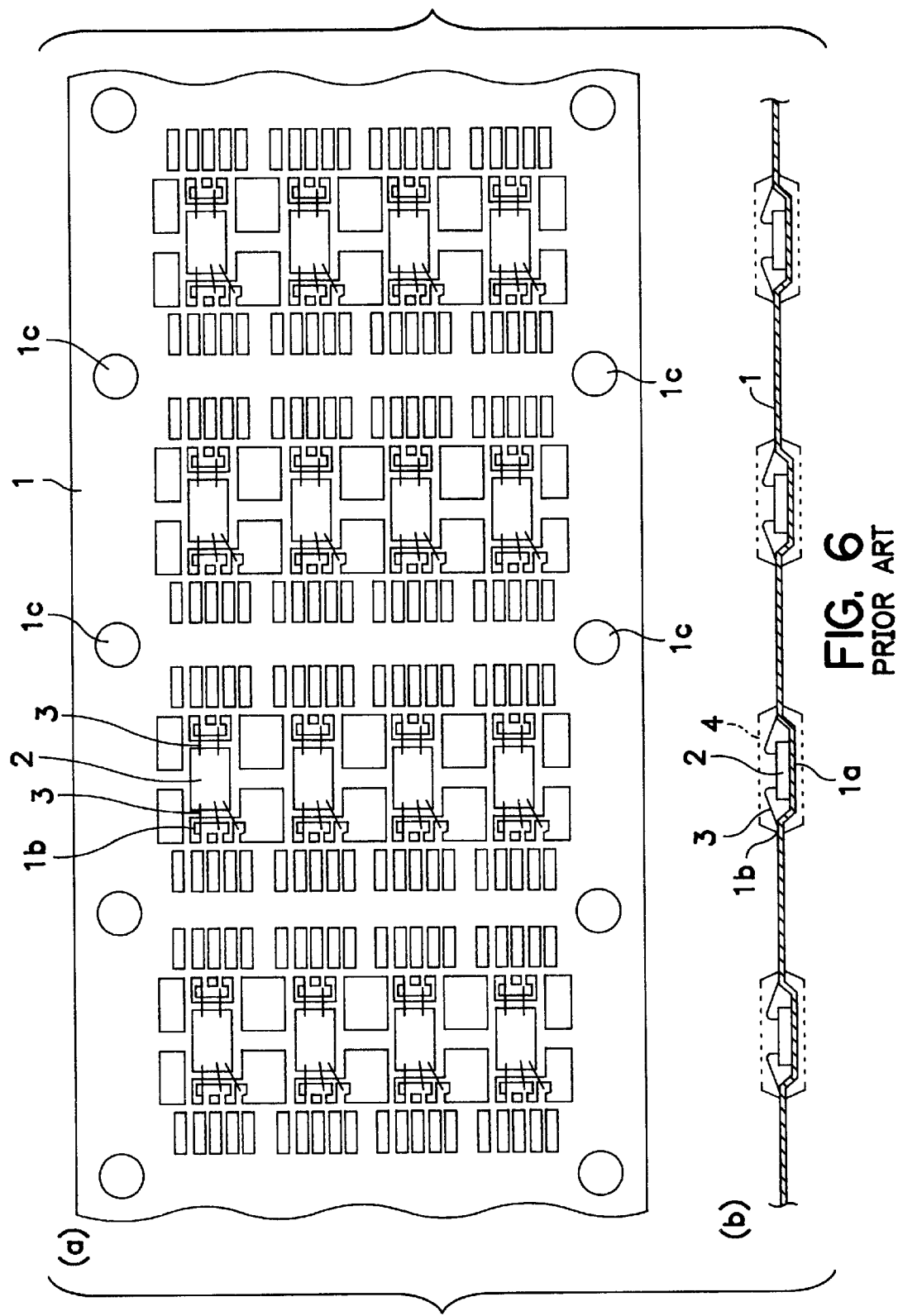

A lead frame 1 on which wire bonding has been completed (as shown in FIG. 6, for instance) is conveyed in the direction of arrow F in FIG. 1 from the wire bonding section (not shown) by the tact operation of the feeding pins 24 of the frame-feeding means 20 and fed onto the frame carrying stand 31 of the inspection device 30.

More specifically, the feeding pin shaft 21 rotates in the direction of arrow E so that the feeding pins 24 engage with the feeding holes 1c of the lead frame 1. Then, the feeding pin shaft 21 is moved by a fixed amount in the direction of arrow D so that the lead frame 1 is fed along the guide rails 10A and 10B by the feeding pins 24. The feeding pin shaft 21 is next rotated in the direction of E' so that the feeding pins 24 are disengaged from the feeding holes 1c of the lead frame 1. Furthermore, the feeding pin shaft 21 is moved in the direction of arrow D' so that the feeding pins 24 return to their original positions. With the successive repetition of this series of operations, the lead frame 1 is caused to pass across the frame carrying stand 31 onto the guide rails 11A and 11B.

As described above, the inspection roller 32 is urged downward in FIG. 3 by the springs 52 and 53 via the raising-and-lowering rods 44 and 45 and the inspection roller holders 40 and 41. Accordingly, when the lead frame 1 passes across (or under) the frame carrying stand 31, the inspection roller 32 is rotated by the moving lead frame 1 since the frame pressing ring parts 32a and 32b of the inspection roller 32 are pressed against the side portions of the moving lead frame 1.

In addition, since the step difference G between the frame pressing ring parts 32a and 32b and the wire detection parts 33 of the inspection roller 32 is set so as to be the upper-limit value of the maximum height of the wires 3, when a high wire loop that exceeds this upper-limit value (or a loop that is higher than the predetermined maximum height) is fed into the area of the inspection roller 32, the wire 3 of such a high loop contacts (one of) the wire detection parts 33. As a result, since wire detection parts 33 are electrically connected to the wiring 65 via the conductive members 35, conductive rod 34, brush 60, spring 63 and bolt 64, an electric current flows through the wire 65 when the wire detection parts 33 contact the wire 3 as described above; as a result, the high loop higher than the upper-limit value is detected.

As seen from the above, the inspection device of the present invention includes a frame carrying stand, which guides and supports a lead frame, and an inspection roller, which is rotated while pressing the side portions of the lead frame against the frame carrying stand. Furthermore, the inspection roller has frame pressing ring parts which are insulating parts and press the side portions of the lead frame against the frame carrying stand, and it also has wire detection parts which are conductive parts and located between the frame pressing ring parts. Moreover, the step difference (or height difference) between the frame pressing ring parts and the wire detection parts is set so as to be the upper-limit value of the maximum height of the wires. Accordingly, an inspection for high loops, particularly for high loops having a height that exceeds the upper-limit value, can be accomplished merely when a lead frame on which wire bonding has been completed is fed beneath the inspection roller. Accordingly, even in cases where the number of wires is large, the wire bonding process and wire inspection process can be done on-line, and all wires can be inspected for the acceptability or unacceptability of high loop shapes. Furthermore, since the structure is extremely simple, an inexpensive inspection device can be manufactured.

In the above structure, since the frame pressing ring parts and the wire inspection parts 33 are formed by machining from a single integral member, the step difference between the frame pressing parts and the wire detection parts can be set with a high degree of precision.

As seen from the above, according to the present invention, the inspection device includes: a frame carrying stand, which is installed in the conveying path of a lead frame so as to guide and support the lead frames, and an inspection roller, which is installed directly above the frame carrying stand and includes frame pressing parts for pressing the side edge portions of the lead frame against the frame carrying stand and wire detection parts located between the frame pressing parts, in which the frame pressing parts are insulating parts and the wire detection parts are conductive parts, the step difference between the frame pressing ring parts and wire detection parts is set so as to be the upper-limit value of the maximum height of the wire loops, so that high loops that exceed such an upper-limit value are detected by an electric current that flows when the wire detection parts contact a bonded wire. Accordingly, even in cases where the number of wires to be inspected is large, high loop shapes can be inspected in a short time. In addition, the wire bonding process and the wire inspection process can be performed on-line, and all wires can be inspected for the acceptability or unacceptability of high loop shapes by an extremely simple structure.

What is claimed is:

1. A bonding wire height inspection device characterized in that said device comprises:

a frame carrying stand which is installed in a conveying path of lead frames conveyed from a wire bonding section and guides and supports said lead frames upon which wires are bonded, and an inspection roller which is installed directly above said frame carrying stand, said inspection roller being provided with frame pressing ring parts, which press side edge portions of said lead frames against said frame carrying stand, and wire detection parts, which are formed between said frame pressing ring parts, wherein said frame pressing ring parts of said inspection roller are formed by insulating parts, while said wire detection parts are formed by conductive parts, and a step difference between said frame pressing ring parts and wire detection parts is formed as an upper-limit value of a maximum height of wire loops, so that loops of said bonded wires that exceed said upper-limit value are inspected by way of a current that flows when said wire detection parts contact bonded wires.

2. A bonding wire height inspection device according to claim 1, wherein both ends of said inspection roller are rotatably supported by inspection roller holders installed on both sides of said frame carrying stand, and said inspection roller holders are urged downward by a spring means.

3. A bonding wire height inspection device according to claim 1, wherein said inspection roller consists of an insulating material, a conductive material is installed in said wire detection parts, a conductive rod is installed in an axial center of said inspection roller so as to extend to an area where said wire detection parts are provided, said wire detection parts and conductive rod are connected by a conductive member, a brush is installed so as to be pressed against said conductive rod, and said loops of said bonded wires that exceed said upper-limit value are inspected said current that flows through said brush when said wire detection parts contact said wires.

4. A bonding wire height inspection device characterized in that said device comprises an inspection roller which is installed directly above a frame carrying stand, said inspection roller having frame pressing ring parts, which consist of insulating parts and press both side edge portions of lead frames, upon which wires are bonded, against said frame carrying stand, and frame detection parts, which consist of conductive parts; said inspection roller consisting of a single integral member, and a step difference between said frame pressing ring parts and wire detection parts being formed so as to be an upper-limit value of a maximum height of wire loops, thus inspecting loops of said wires that exceed said upper-limit value by way of a current that flows when said wire detection parts contact said wires.

5. A bonding wire height inspection device according to claim 1, wherein both ends of said inspection roller are rotatably supported by inspection roller holders installed on both sides of said frame carrying stand, and said inspection roller is urged toward said frame carrying stand by a spring means which is installed in said inspection roller holders.

* * * * *